(12) United States Patent  
Atanackovic et al.

(10) Patent No.: US 7,904,261 B2
(45) Date of Patent: Mar. 8, 2011

(54) METHOD AND SYSTEM FOR USING PHASOR MEASUREMENTS IN STATE ESTIMATION OF POWER SYSTEMS

(75) Inventors: Djordje Atanackovic, British Columbia (CA); Greg S. Dwernychuk, British Columbia (CA); Jose Clapauch, Vancouver (CA)

(73) Assignee: British Columbia Hydro and Power Authority, Vancouver, British Columbia (CA)

( * ) Notice: Subject to any disclaimer, the term of this patent is extended or adjusted under 35 U.S.C. 154(b) by 99 days.

(21) Appl. No.: 11/895,786

(22) Filed: Aug. 24, 2007

(65) Prior Publication Data

US 2008/0059088 A1    Mar. 6, 2008

Related U.S. Application Data

(60) Provisional application No. 60/839,699, filed on Aug. 24, 2006.

(51) Int. Cl.
*G01R 21/06* (2006.01)
(52) U.S. Cl. ............ 702/60; 702/65; 324/108; 324/141; 324/142
(58) Field of Classification Search ............... 702/57–62, 702/64, 65, 85; 324/74, 103 R, 107, 108, 324/140 R, 141, 142, 140 D; 700/286, 293, 700/294, 297
See application file for complete search history.

(56) References Cited

U.S. PATENT DOCUMENTS

| 4,907,165 A | * | 3/1990 | Toda ............................... 702/60 |
| 6,185,508 B1 | * | 2/2001 | Van Doorn et al. ............. 702/60 |
| 6,694,270 B2 | * | 2/2004 | Hart ................................ 702/57 |

OTHER PUBLICATIONS

Slutsker, Ilya W. et al., "Implementation of Phasor Measurements in State Estimator at Sevillana de Electricidad", Power Industry Computer Application Conference, Conference Proceedings, 1995 IEEE, pp. 392-398 (May 7-12, 1995).

Chen, Jian, "Improved Bad Data Processing via Strategic Placement of PMUs" Power Engineering Society General Meeting, 2005 IEEE, pp. 509-513, vol. 1 (Jun. 12-16, 2005).

* cited by examiner

*Primary Examiner* — Manuel L Barbee
(74) *Attorney, Agent, or Firm* — Nixon Peabody LLP

(57) ABSTRACT

A method of state estimation is provided, including: (a) acquiring a plurality of positive sequence voltage and current phasor measurements; (b) designating a reference positive sequence voltage phasor measurement from the acquired phasor measurements; (c) correcting the acquired phasor measurements to account for the reference phasor measurement; (d) calculating complex power having a real component and an imaginary component, using the corrected positive sequence voltage and current phasor measurement; (e) using the real component of said complex power as a calculated mega-watt and the imaginary component of the complex power as a calculated mega-volt-ampere; and (f) using the mega-watt and mega volt-ampere calculations in a state estimation algorithm.

12 Claims, 2 Drawing Sheets

METHOD AND SYSTEM FOR USING PHASOR MEASUREMENTS IN STATE ESTIMATION OF POWER SYSTEMS

CROSS-REFERENCE TO RELATED PATENT APPLICATION OR PRIORITY CLAIM

This application claims the benefit of U.S. Provisional Patent Application No. 60/839,699, filed Aug. 24, 2006, which is hereby incorporated by reference.

FIELD OF THE INVENTION

This invention is in the field of real-time power network state estimation, and more particularly to the use of phasor measurements, also referred to as "phasors" or "phasor measurement units", in such state estimation.

BACKGROUND

Electric power state estimation plays an important role in monitoring and controlling power systems. These estimations are used for network security purposes, optimization purposes and for use by dispatchers. The measurement set for estimation in the prior art factor voltage magnitude, branch real and reactive power flow, real and reactive power injection and/or ampere magnitude. Some recent developments have included voltage phase angle measurement as an additional factor.

It has shown to be difficult to properly tune the error for voltage phase angle measurement. As this measurement error is an essential input to state estimation, this significantly affects state estimator output results and convergence robustness. Changes in the system frequency and loss of phase angle reference may have a significant negative impact on the angle measurement accuracy. Furthermore, previous attempts at using voltage phase angle measurement did not take advantage of the availability of complex bus voltage and complex current in each branch that is adjacent to the bus. Failure to use the complex bus voltage and complex current significantly reduced a system's capability of improving measurement redundancy and ensuring observability in otherwise unobservable areas. Finally, equations used in prior art state estimation models did not include phase angle measurements, which would require the development of a new equation type.

The references below disclose the basic principles related to phasor measurement utilizations in state estimation in the prior art. Previous attempts to introduce phasors to state estimation are based on such principles. "Implementation of phasor measurements in state estimator at Sevillana de Electricidad", by Slutsker et al. (Power Industry Computer Application Conference, 1995, Conference Proceedings, 1995 IEEE, 7-12 May 1995 Page(s): 392-398 Digital Object Identifier 10.1109/PICA.1995.515269) discloses an implementation of phase angle measurements in an industrial state estimator using enhancements to the state estimator algorithm. "Improved Bad Data Processing via Strategic Placement of PMUs" by Chen et al. (Power Engineering Society General Meeting, 2005, IEEE 12-16 Jun. 2005 Page(s): 509-513 Vol. 1 Digital Object Identifier 10.1109/PES.2005.1489694) discloses a placement algorithm for using phasor measurement units to detect bad data in a state estimator.

SUMMARY OF THE INVENTION

A method of state estimation is provided, including: (a) acquiring a plurality of positive sequence voltage and current phasor measurements; (b) designating a reference positive sequence voltage phasor measurement from the acquired phasor measurements; (c) correcting the acquired phasor measurements to account for the reference phasor measurement; (d) calculating complex power having a real component and an imaginary component, using the corrected positive sequence voltage and current phasor measurement; (e) using the real component of said complex power as a calculated mega-watt and the imaginary component of the complex power as a calculated mega-volt-ampere; and (f) using the mega-watt and mega volt-ampere calculations in a state estimation algorithm.

The phasor measurements may be synchronized using a global positioning system. The phasor measurements may include a magnitude and a phase angle. Standard deviations may be calculated to monitor accuracy of the phasor measurements. The phasor measurement units may be located at a plurality of substations. The reference phasor measurement may be selected from a larger than average substation.

A method of state estimation is provided, including (a) acquiring a plurality of phasor measurements; (b) calculating complex power having a real part and an imaginary part, using the phasor measurements; (c) using the real part of the complex power as a calculated mega-watt and the imaginary part of the complex power as a calculated mega volt-ampere; and (d) using the mega-watt and mega volt-ampere calculations in a state estimation algorithm.

The method may include correcting the acquired phasor measurements, and determining a standard deviation for the acquired phasor measurements. The acquired phasor measurements may be synchronized. The complex power is calculated as $\sqrt{3}VI^*$, wherein V is the complex bus voltage and I is the complex current. A Discrete Fourier Transformation for complex voltage may be:

$$V = (\sqrt{2}/N) * \Sigma V_k e^{-jk2\pi/N}, k=1, N-1$$

wherein N is a number of samples of voltage measurements ($V_k$) in a period of fundamental frequency, and V is the calculated complex voltage.

A system for providing state estimation is provided, including: a computer; and a plurality of phasor measurement units, the phasor measurement units located at a plurality of power substations; wherein the phasor measurement units provide positive sequence voltage and current phasor measurements to the computer, and the computer calculates complex power having a real component and an imaginary component, using said positive sequence voltage and current phasor measurements; and uses the real component of said complex power as a calculated mega-watt and the imaginary component of the complex power as a calculated mega volt-ampere; and uses the calculated mega-watt and calculated mega volt-ampere calculations in a state estimation algorithm. The phasor measurement units are located at a plurality of substations. The phasor measurements provided to the computer from the phasor measurement units are synchronized.

The invention addresses the use of phasor telemetry in state estimator applications in a real-time energy management system. Furthermore, the phasor measurement units are used to provide additional information to the state estimator including complex bus voltage and complex current in each branch adjacent to a selected bus.

The method according to the invention converts the measurements of complex currents in branches and the complex bus voltage into equivalent mega-watt ("MW") and mega-volt-ampere ("MVAR") branch flow measurements. These measurements are then added to the state estimator measurement set and are used in a similar fashion as other power measurements in the state estimator. The creation of a new equation type for including phasor measurements is thus avoided.

The method according to the invention increases robustness and accuracy of the state estimator function in energy management systems. Improved state estimation provides a better view into the real-time power system conditions, which helps system operators operate the power system more efficiently and economically.

The advantages of the method according to the invention are summarized as follows:

1. The tuning of measurement errors is simplified as power measurement performance is more intuitive. Errors caused by frequency deviation and the loss of a reference angle are eliminated by the power conversion process (as the phase angle errors and the correction for reference angle are both cancelled out).
2. The MW, MVAR branch flow measurement pairs significantly increase measurement redundancy and are effective in providing measurement observability in unobservable network areas.
3. The power measurements obtained from the complex phasors are more accurate than other conventional power measurements due to the inherent accuracy of the complex phasor components from which these measurements are derived.
4. The addition of inherently accurate phasor measurements improves the overall quality of state estimation, as the estimated values in those areas in which accurate telemetry is added tend to improve significantly, not only at the locations where phasor measurement is introduced but also at other adjacent locations.

There are two possible ways to introduce phasor telemetry into state estimation. The more common approach, which has been attempted by vendors and other utilities, requires defining a new state estimation measurement equation for the voltage phase angle. The alternative approach, according to the invention, is to convert phasor telemetry into equivalent complex power, and use the MW and MVAR components thereof as independent calculated measurements in the state estimation.

An advantage of defining a new state estimation measurement equation for the voltage phase angle is the simplicity of the state estimator equation, which is linear and of the same form as the equation defined for voltage magnitude, and which therefore can be easily added into the state estimation matrix. A disadvantage is the difficulty of tuning measurement errors for phase angle quantities. Furthermore, the estimated and measured phase angles cannot be easily compared to any other independent telemetry thus making measurement performance analysis difficult. Also, the addition of a phase angle measurement does not yield an effective improvement in observability and redundancy, as does the use of the MW and MVAR pair.

Another disadvantage of a direct use of phase angle measurements is related to the dependence of such angles on a phase angle reference. If the phase angle reference is lost or corrupted the phase angle measurements are useless unless a new reference is adopted. Moreover, a small error in the reference angle measurement can significantly affect other phase angle measurements that are corrected with the same reference.

These disadvantages of a direct phase angle application are addressed in the method according to the invention that converts phasor telemetry into equivalent complex power, and uses MW and MVAR components as independent calculated measurements in the state estimation formula. In the method according to the invention, the power conversion approach does not require the modification of existing state estimator software, as there is no need to define a new equation.

Also, it is easier to tune MW and MVAR measurement errors as MW and MVAR flows are more intuitive to a user than phase angles. In addition, the comparable Supervisory Control and Data Acquisition (SCADA) analog telemetry and state estimator results are available for measurement performance analysis and for tracking historical subsystems.

Finally, synchronization problems which may affect the reference phase angle are not applicable in the method according to the invention, as an error in the reference does not propagate into equivalent power calculations because the complex voltage and current components are obtained from the same phasor measurement unit (PMU) and hence are synchronized.

Because of the above-mentioned advantages the power conversion approach according to the invention is preferable, and is introduced into a state estimator in the form of calculated MW, MVAR measurement pairs. The MW and MVAR values are calculated from complex phasor voltages and currents for each branch wherein phasor components are available. The calculated MW and MVAR measurements are added to the state estimator measurement set and are further treated as any other power measurement in state estimation. The accuracy of power measurements converted from phasor components is within 1% according to tests carried out in a real-time environment.

DESCRIPTION OF THE INVENTION

Figure 1:
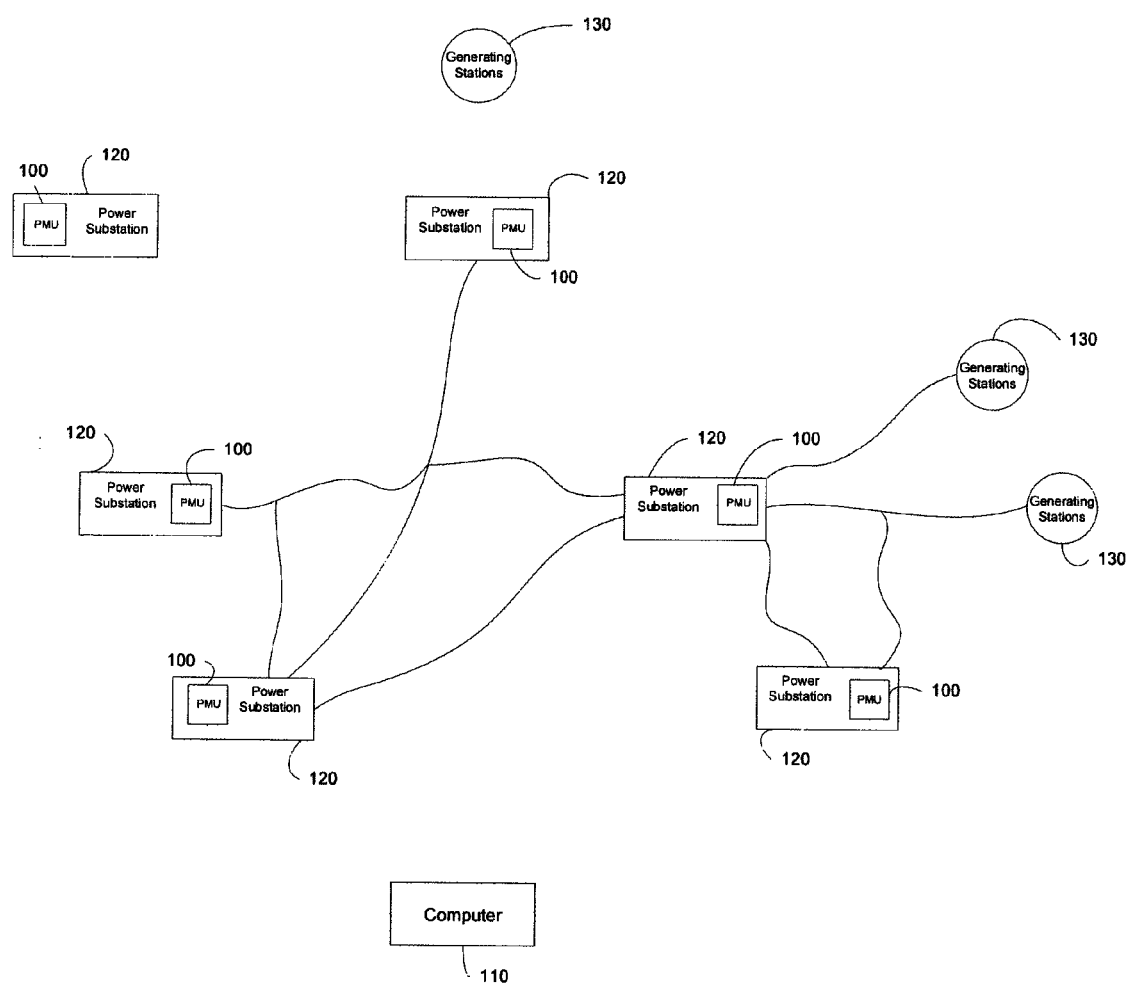
FIG. 1 is a block diagram showing a power network according to the invention.

A preferred embodiment of a synchrophasor system according to the invention, as seen in FIG. 1, includes a network of generating stations 130, and power substations 120, with PMUs 100 located at one or more power substations 120, each PMU 100 measuring and streaming live electric system data (at a rate such as 20 to 40 frames per second) to a computer 110. Computer 110 may be a conventional computer, having a processor, a memory, a database, input means and output means. The PMUs 100 convey information to computer 110 via conventional means, including over a wired network, as shown in FIG. 1, or a wireless network, or both.

PMUs 100 monitor the primary transmission line quantities of voltage and current (referred to herein as V and I, respectively) and calculate the three-phase positive sequence value of these quantities. These calculations are updated frequently (for example at 20 to 40 times per second). A feature of these measurements is that the data sampling and calculations are synchronized (preferably to better than one microsecond) using a clock signal, for example from Global Positioning System (GPS) satellites.

The GPS synchronized measurements allow for alignment of information from each substation 120 even if they are spaced hundreds of kilometres apart. These measurements permit the application of advanced computational methods to determine the operating condition or "health" of the power grid, which leads to methods for determining power system stability and advanced control systems.

Figure 2:
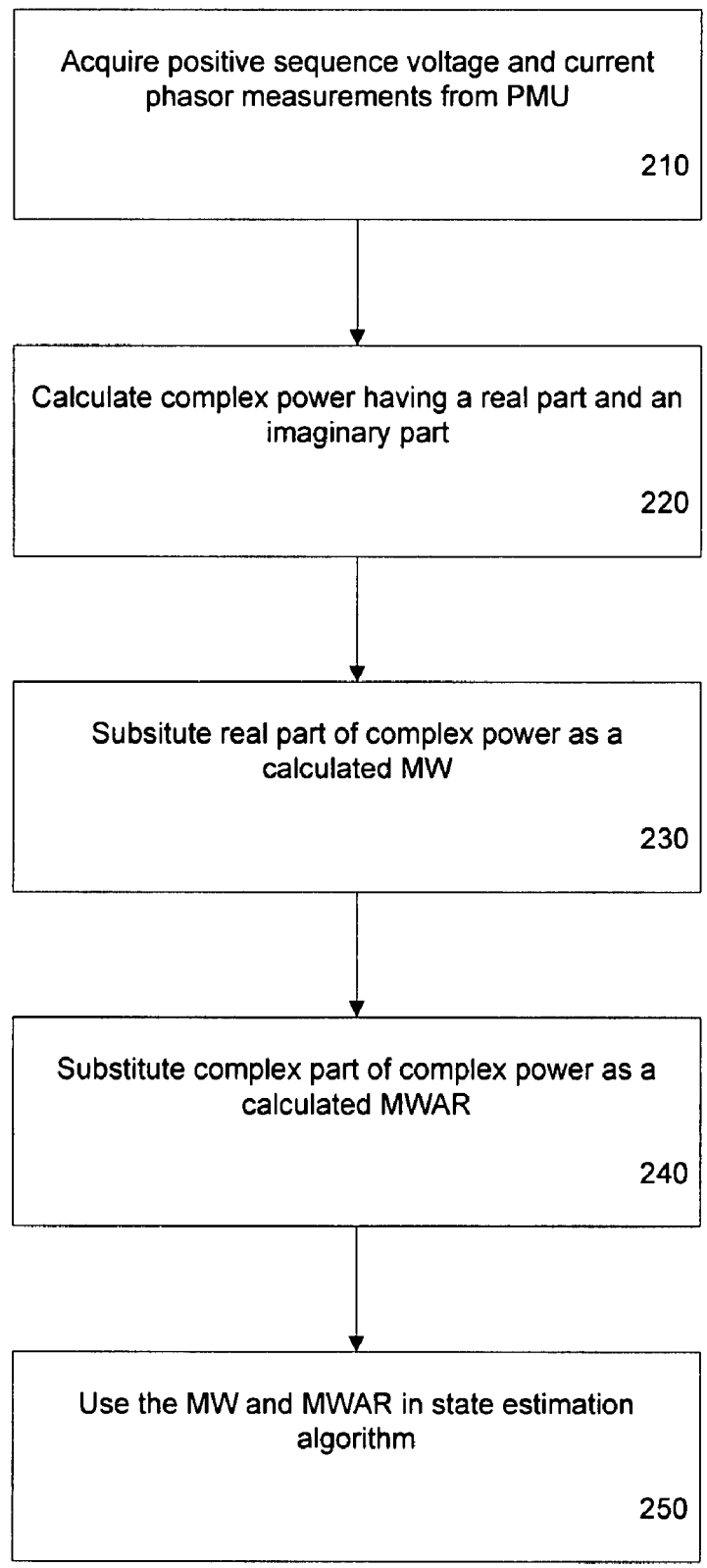
FIG. 2 is a flow chart showing the method of state estimation according to the invention.

As seen in FIG. 2, each PMU 100 provides central host computer 110 real-time complex bus voltage and complex current flow values for each branch line adjacent to substation 120 at which the PMU 100 is located. These values are determined by the PMU by means of synchronized magnitude sampling using Discrete Fourier Transformation (DFT). Sampling synchronization between different substations 120 is achieved via GPS, preferably, within 1 us accuracy, although higher values, such as 10 us are also acceptable. Current and voltage magnitudes are sampled from conventional metering equipment e.g., potential and current transformers, that are also used to provide conventional SCADA analog telemetry. As described below in detail, a phasor measurement is designated as a reference phasor measurement in computer 110, and the other acquired phasor measurements are corrected in light of the reference phasor measurement.

Phase measurements are sampled several times during short periods, for example periods of 1/30th of a second. These phase measurements are introduced into DFT to determine the corresponding complex voltage and current values. Positive sequence complex voltages and currents are then calculated using symmetric decomposition (step 240). This process occurs about 30 times a second within PMU 100. The DFT calculation for complex voltage is performed according to the equation:

$$V = (\sqrt{2}/N) * \Sigma V_k e^{-jk2\pi/N}, k=1, N-1$$

wherein N is the number of samples of real-time voltage magnitude measurements ($V_k$) per period of fundamental frequency, and V is the calculated complex voltage. The above equation is obtained by sampling voltage magnitude inputs, which can be also expressed in the complex form as:

$$V = a + jb$$

wherein "a" and "b" are, respectively, the real and imaginary part of the voltage phasor. The DFT calculation for complex current is performed according to a similar equation:

$$I = (\sqrt{2}/N) * \Sigma I_k e^{-jk2\pi/N}, k=1, N-1$$

wherein N is the number of samples of real-time current magnitude measurements ($I_k$) per period of fundamental frequency, and I is the calculated complex voltage.

The use of positive sequence values, the nature of DFT calculation, and the frequent and synchronized sampling, render the resulting complex phasor measurements more accurate than their analog counterparts. In the state estimator model, conventional SCADA analog MW and MVAR telemetry is characterized with 2-20% error range while comparable phasor telemetry is assigned 1-3% error.

In step 210, the phasors are transmitted from PMUs 100 in polar coordinates i.e. they are represented by both a magnitude and a phase angle. Within the computer 110, a phasor measurement is designated as a reference and phase angles of all other phasor measurements are corrected to account for the reference angle. Any of the available phasor quantities can be selected to be a reference. In a preferred embodiment of the invention, a phasor measurement from one of the largest or more significant substations is selected as the reference.

The other (i.e. non-reference) phasor measurements are corrected by subtracting the reference phase angle value from the value of the angle being corrected. Thus, the reference phase angle, when corrected, becomes equal to zero (0) degrees, i.e. it is referenced to itself, whereas all other phase angles are adjusted by the aforementioned subtraction in order to be referenced with respect to the reference angle. For each phasor measurement, the mean and the standard deviation is dynamically updated for recently acquired samples of a phase angle (for example every two seconds using the most recent three acquired samples of a phase angle during the two second period) in order to monitor the phase angle stability.

In step 220, the complex power is then calculated as:

$$\sqrt{3}VI^*$$

wherein V and I* are the positive sequence complex bus voltage and the conjugated positive sequence complex current branch flow after correction within computer 110. As they are corrected to the same phasor measurement reference, the reference effect is cancelled in the complex power result. In step 230, the real part of the complex power measurement is used as the calculated MW flow, and in step 240, the imaginary part of the complex power measurement is used as the calculated MVAR flow. This power calculation is performed periodically, for example every two seconds. The standard deviation of calculated MW and MVAR is determined dynamically based on a number of recently calculated values (for example, the five most recent calculated values). In step 250, the MW and MVAR measurements converted from the phasors are added to the state estimator measurement set, to be used as known in the art during the state estimation process.

Technique of Synchrophasor Integration

The benefits of the phasor addition to state estimation include improvements in observability and redundancy.

Although phasors are inherently considered accurate measurements, tests were implemented to test the phasor measurements' quality by using a state estimator. This test was considered effective because of the state estimator's capability to detect bad data, and its ability to assign a quality index to analog measurements.

The following criteria derived from state estimation were employed for the assessment of phasor measurement quality and the impact on state estimator performance:

Mean and standard deviation of MW and MVAR measurements derived from complex phasor voltages and currents were calculated based on the five most recent calculated samples of the monitored measurement. Standard deviation of each measurement was stored in a historical database for ease of access. Phasor performance was considered acceptable if its standard deviation did not exceed 3% of the mean for 99% of the time during each 24-hour observation period. This criterion was established to verify the performance of data acquisition and communication systems, which were responsible for acquiring, pre-processing and transferring phasors to the database at the central host computer 110. If this criterion was violated the measurement was removed from the state estimator set. The standard deviation of all monitored phasors did not exceed 1% of the mean 99% of the time. Therefore, the phasors performed above the expectations set by this criterion.

A state estimator total cost index as well as partial cost indices were calculated for every state estimator run. The total cost index reflected the overall accuracy of the telemetry. The partial cost index was calculated for a pre-defined subset of measurements in a substation where a phasor measurement was added. The partial cost index reflected the impact of phasor measurement on residuals incurred by adjacent SCADA analog measurements. Phasor performance was considered acceptable if the total and partial cost functions did not exhibit spikes larger than 5% of the 24-hour average cost value 99% of the time during each 24-hour observation period. This criterion ensured that no negative impact was caused by phasors on the overall state estimator robustness. The real-time phasor performance was well within acceptability limits set by this criterion.

A normalized residual index that characterized the quality of each measurement in state estimator model was calculated for each measurement in every state estimator run. This index was calculated based on an absolute residual (the difference between measured and estimated value) and a measurement error. The relative size of the error with respect to the errors of all other measurements in the set was also taken into account when normalizing measurement residuals. A phasor measurement was considered acceptable if its normalized residual value did not exceed 6.0 units 99% percent of the time during each 24 hours observation period. This threshold was derived from experience in state estimator maintenance and was based on the size of the measurement set and characteristics of analog measurements in a state estimator model. If this criterion was violated the measurement was removed from state estimator set. The real-time phasor performance was well within acceptability limits set by this criterion.

Although the particular preferred embodiments of the invention have been disclosed in detail for illustrative purposes, it will be recognized that variations or modifications of the disclosed apparatus lie within the scope of the present invention.

We claim:

1. A method for using phasor measurements in state estimation, comprising:
   (a) acquiring a plurality of positive sequence voltage and current phasor measurements from a plurality of phasor measurement units, and sending said phasor measurements to a computer;
   (b) designating a reference positive sequence voltage phasor measurement from said acquired phasor measurements;
   (c) said computer adjusting said acquired phasor measurements to account for said reference phasor measurement by subtracting a phase angle value from a pre-selected reference phasor measurement from each of said acquired phasor measurements;
   (d) calculating complex power having a real component and an imaginary component, using said corrected positive sequence voltage and current phasor measurement;
   (e) using said real component of said complex power as a calculated mega-watt and said imaginary component of said complex power as a calculated mega-volt-ampere; and
   (f) using said mega-watt and mega volt-ampere calculations in a state estimation algorithm.

2. The method of claim 1, wherein said phasor measurements are synchronized.

3. The method of claim 2 wherein said phasor measurement are synchronized using global positioning system.

4. The method of claim 3 wherein said phasor measurements include a magnitude.

5. The method of claim 4 wherein standard deviations are calculated to monitor accuracy of said phasor measurements.

6. The method of claim 5 wherein phasor measurement units located at a plurality of substations acquire said plurality of voltage and current phasor measurements.

7. The method of claim 6 wherein said reference positive sequence voltage phasor measurement is selected from a larger than average substation.

8. A method for using phasor measurements in state estimation, comprising:
   (a) acquiring a plurality of phasor measurements from a plurality of phasor measurement units;
   (b) calculating complex power having a real part and an imaginary part, using said phasor measurements, and using a computer;
   (c) using said real part of said complex power as a calculated mega-watt and said imaginary part of said complex power as a calculated mega volt-ampere; and
   (d) using said mega-watt and mega volt-ampere calculations in a state estimation algorithm, the method further comprising:
   adjusting said acquired phasor measurements by subtracting a phase angle value from a pre-selected reference phasor measurement from each of said acquired phasor measurements.

9. The method of claim 8 further comprising:
   determining a standard deviation for said acquired phasor measurements.

10. The method of claim 9, further comprising:
    synchronizing said acquired phasor measurements.

11. The method of claim 10, wherein said complex power is calculated as $\sqrt{3}VI^*$, wherein V is a complex bus voltage, I is a complex current, and I* is a conjugate of said complex current.

12. The method of claim 11, wherein a Discrete Fourier Transformation used for complex voltage is:

$$V = (\sqrt{2}/N) * \Sigma V_k e^{-jk2\pi/N}, k=1, N-1$$

wherein N is a number of samples of voltage measurements ($V_k$) in a period of fundamental frequency, and V is said calculated complex voltage.

* * * * *